US011195729B2

(12) United States Patent
Watanabe et al.

(10) Patent No.: US 11,195,729 B2
(45) Date of Patent: Dec. 7, 2021

(54) SUBSTRATE POLISHING APPARATUS AND METHOD

(71) Applicant: EBARA CORPORATION, Tokyo (JP)

(72) Inventors: Yuki Watanabe, Tokyo (JP); Keita Yagi, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 531 days.

(21) Appl. No.: 16/044,137

(22) Filed: Jul. 24, 2018

(65) Prior Publication Data

US 2019/0027382 A1 Jan. 24, 2019

(30) Foreign Application Priority Data

Jul. 24, 2017 (JP) .............................. JP2017-142545

(51) Int. Cl.
*H01L 21/67* (2006.01)
*B24B 37/013* (2012.01)
(Continued)

(52) U.S. Cl.
CPC ............ *H01L 21/67* (2013.01); *B24B 37/013* (2013.01); *B24B 37/105* (2013.01); *B24B 37/32* (2013.01); *B24B 49/05* (2013.01)

(58) Field of Classification Search
CPC ......... H01L 21/67; H01L 22/12; H01L 22/14; H01L 22/20; H01L 22/34;
(Continued)

(56) References Cited

U.S. PATENT DOCUMENTS 6,290,572 B1 * 9/2001 Hofmann .............. B24B 37/013
451/287
6,747,283 B1 6/2004 Amartur
(Continued)

FOREIGN PATENT DOCUMENTS

CN 1698185 A 11/2005
CN 1726116 A 1/2006
(Continued)

OTHER PUBLICATIONS

Singapore Patent Application No. 10201806221T; Examination and Search Report; dated Oct. 13, 2020; 8 pages.

*Primary Examiner* — Joseph J Hail
*Assistant Examiner* — Michael A Gump
(74) *Attorney, Agent, or Firm* — BakerHostetler (57) ABSTRACT

A substrate polishing apparatus includes a top ring for pressing a substrate against a polishing pad to perform substrate polishing; a spectrum generating unit that directs light onto a surface of the substrate of interest for polishing, receives reflected light, and calculates a reflectivity spectrum corresponding to the wavelength of the reflected light; and a storage that stores a plurality of thickness estimating algorithms for estimating the thickness of the polished surface in accordance with the reflectivity spectrum. A plurality of thickness estimating algorithms is selected among the thickness estimating algorithms stored in the storage, and a switching condition is set. The thickness of the polished surface is estimated by using the set thickness estimating algorithms, and if the switching condition is satisfied, the thickness estimating algorithm to be applied is switched.

7 Claims, 9 Drawing Sheets

(51) Int. Cl.
*B24B 49/05* (2006.01)
*B24B 37/32* (2012.01)
*B24B 37/10* (2012.01)

(58) Field of Classification Search
CPC .......... H01L 2924/01079; B24B 49/02; B24B 49/04; B24B 49/05; B24B 49/12; B24B 37/005; B24B 37/013; B24B 37/042; B24B 37/10; B24B 37/32; B24B 37/30; B24B 37/34; B24B 37/105; B24B 37/107
USPC ..... 438/14, 15, 16, 17, 18; 451/5, 6, 10, 11, 451/41, 287
See application file for complete search history.

(56) References Cited

U.S. PATENT DOCUMENTS

| | | | |
|---|---|---|---|
| 6,991,514 B1 | 1/2006 | Meloni et al. | |
| 2001/0012108 A1 | 8/2001 | Holzapfel et al. | |
| 2003/0022400 A1 | 1/2003 | Nomoto et al. | |
| 2005/0107015 A1 | 5/2005 | Togawa et al. | |
| 2005/0191859 A1 | 9/2005 | Fujikake | |
| 2006/0040191 A1* | 2/2006 | Okita | G03F 9/7003 430/22 |
| 2006/0166606 A1 | 7/2006 | Kobayashi et al. | |
| 2009/0130956 A1 | 5/2009 | Ohta et al. | |
| 2010/0015889 A1 | 1/2010 | Shimizu et al. | |
| 2010/0093259 A1 | 4/2010 | Lee et al. | |
| 2012/0019830 A1* | 1/2012 | Kimba | B24B 49/12 356/445 |
| 2012/0323355 A1 | 12/2012 | David et al. | |
| 2013/0237128 A1 | 9/2013 | David et al. | |
| 2015/0120242 A1* | 4/2015 | David | G01B 11/06 702/172 |
| 2015/0147829 A1* | 5/2015 | Benvegnu | H01L 22/12 438/8 |
| 2015/0228069 A1 | 8/2015 | Fresquet et al. | |
| 2016/0354894 A1 | 12/2016 | Kimba | |
| 2017/0148655 A1* | 5/2017 | Kobayashi | H01L 22/12 |
| 2017/0190020 A1* | 7/2017 | Kobayashi | B24B 37/32 |

FOREIGN PATENT DOCUMENTS

| | | |
|---|---|---|
| CN | 101523565 A | 9/2009 |
| CN | 101722469 A | 6/2010 |
| CN | 104620071 A | 5/2015 |
| CN | 106239352 A | 12/2016 |
| JP | 3932836 B2 | 6/2007 |
| JP | 2009-129970 A | 6/2009 |
| JP | 2011-519421 A | 7/2011 |
| JP | 2011-224678 A | 11/2011 |
| JP | 2012-028554 A | 2/2012 |
| JP | 2014-103215 A | 6/2014 |
| WO | WO 2009/129346 A2 | 10/2009 |
| WO | WO 2015/0163164 A1 | 10/2015 |
| WO | WO 2016/010821 A1 | 1/2016 |
| WO | WO-2016163352 A1 * | 10/2016 ........... B24B 37/107 |

* cited by examiner

SUBSTRATE POLISHING APPARATUS AND METHOD

CROSS-REFERENCE TO RELATED APPLICATIONS

This application claims the benefit of Japanese Priority Patent Application JP 2017-142545 filed on Jul. 24, 2017, the entire contents of which are incorporated herein by reference.

FIELD

The present invention relates to a substrate processing apparatus and method used to process the surface of a substrate, such as a semiconductor wafer.

BACKGROUND AND SUMMARY

A substrate polishing apparatus is widely known which is used to polish the surface of a substrate, such as a semiconductor wafer, by so-called chemical mechanical polishing (CMP). Such a substrate polishing apparatus includes a thickness measuring device for measuring the thickness of a substrate being polished.

A known thickness measuring device is an optical thickness measuring device. This optical thickness measuring device irradiates the surface of a substrate with measurement light and receives measurement light reflected off the substrate in order to acquire the spectrum. Since the spectral characteristics of reflected light change depending on the thickness of the substrate, a thickness measuring device analyzes the spectrum of the reflected light according to a predetermined algorithm, and estimates the thickness of the substrate (WO2015/163164).

With increasing degrees of integration and density of semiconductor devices, circuit wiring has become finer and a larger number of layers have been used in multilayer wiring. For this reason, the planarization of a semiconductor device surface and the accuracy of detecting an interface between a layer of interest for polishing and a base layer during the manufacture process have become increasingly important. It is therefore preferred to accurately measure the thickness of a substrate being polished, so that the timing of the termination of polishing of the substrate can be appropriately controlled.

In the case where the thickness of a substrate is estimated according to the spectrum of reflected light, if linearity is found in changes in the spectrum, the estimated thickness should be reliable, and if changes in the spectrum are not constant (non-linear), the estimated thickness is less reliable. Besides, when the substrate has a large thickness (or a small thickness), some algorithms for estimating the thickness cause errors in the estimated thickness, thereby impairing reliability in the obtained thickness. In addition, although the algorithm used to estimate an optimum thickness changes depending on the remaining-thickness, a conventional scheme does not take a remaining-thickness into consideration.

An object of the present invention is to provide a substrate polishing apparatus and method that allow the end of polishing of a substrate to be appropriately detected, by more accurately estimating the thickness of the substrate being polished.

A substrate polishing apparatus that is one aspect of the present invention includes: a top ring for pressing a substrate against a polishing pad to perform substrate polishing; a spectrum generating unit that directs light onto a polished surface of the substrate, receives reflected light, and calculates a reflectivity spectrum corresponding to the wavelength of the reflected light; a storage that stores a plurality of thickness estimating algorithms for estimating the thickness of the polished surface in accordance with the reflectivity spectrum; an algorithm setting unit that selects a plurality of thickness estimating algorithms among the thickness estimating algorithms stored in the storage, and sets a switching condition; and a thickness estimating unit that estimates the thickness of the polished surface by using the thickness estimating algorithms set through the algorithm setting unit, and if the switching condition is satisfied, switches the thickness estimating algorithm to be applied.

The above-described substrate polishing apparatus preferably includes an end detecting unit that outputs a control signal for commanding the end of the substrate polishing when the thickness of the polished surface reaches a predetermined target value.

In addition, it is preferable that the thickness estimating algorithm be switched when the estimated thickness of the polished surface reaches a set value. Alternatively, it is preferable that the thickness estimating algorithm be switched when a difference between the thicknesses estimated using two thickness estimating algorithms is below a predetermined value.

In the above-described substrate polishing apparatus, it is preferable that before the thickness estimating algorithm is switched, the thickness of a polished surface be estimated through a weighting function using two thickness estimating algorithms used before and after the switching. This prevents the estimated value from being discontinuous before and after the switching of the algorithm. In addition, it is preferable that the thickness estimating algorithm include a first method that estimates a thickness by using FFT and a second method that estimates a thickness by using Fitting, and be switched from the first method to the second method.

A substrate polishing method that is one aspect of the present invention is a substrate polishing method for pressing a substrate against a polishing pad to perform substrate polishing, including the steps of: directing light onto a polished surface of the substrate, receiving reflected light, and calculating a reflectivity spectrum corresponding to the wavelength of the reflected light; selecting a plurality of thickness estimating algorithms by using a storage that stores a plurality of thickness estimating algorithms for estimating the thickness of the polished surface in accordance with the reflectivity spectrum, and setting a switching condition; and estimating the thickness of the polished surface by using the set thickness estimating algorithms, and if the switching condition is satisfied, switching the thickness estimating algorithm to be applied.

DETAILED DESCRIPTION OF NON-LIMITING EXAMPLE EMBODIMENTS

A substrate processing apparatus according to one embodiment of the present invention will now be described with reference to the accompanying drawings. It should be noted that the same or corresponding components will be denoted by the same reference numeral and overlapping description will be omitted.

Figure 1:
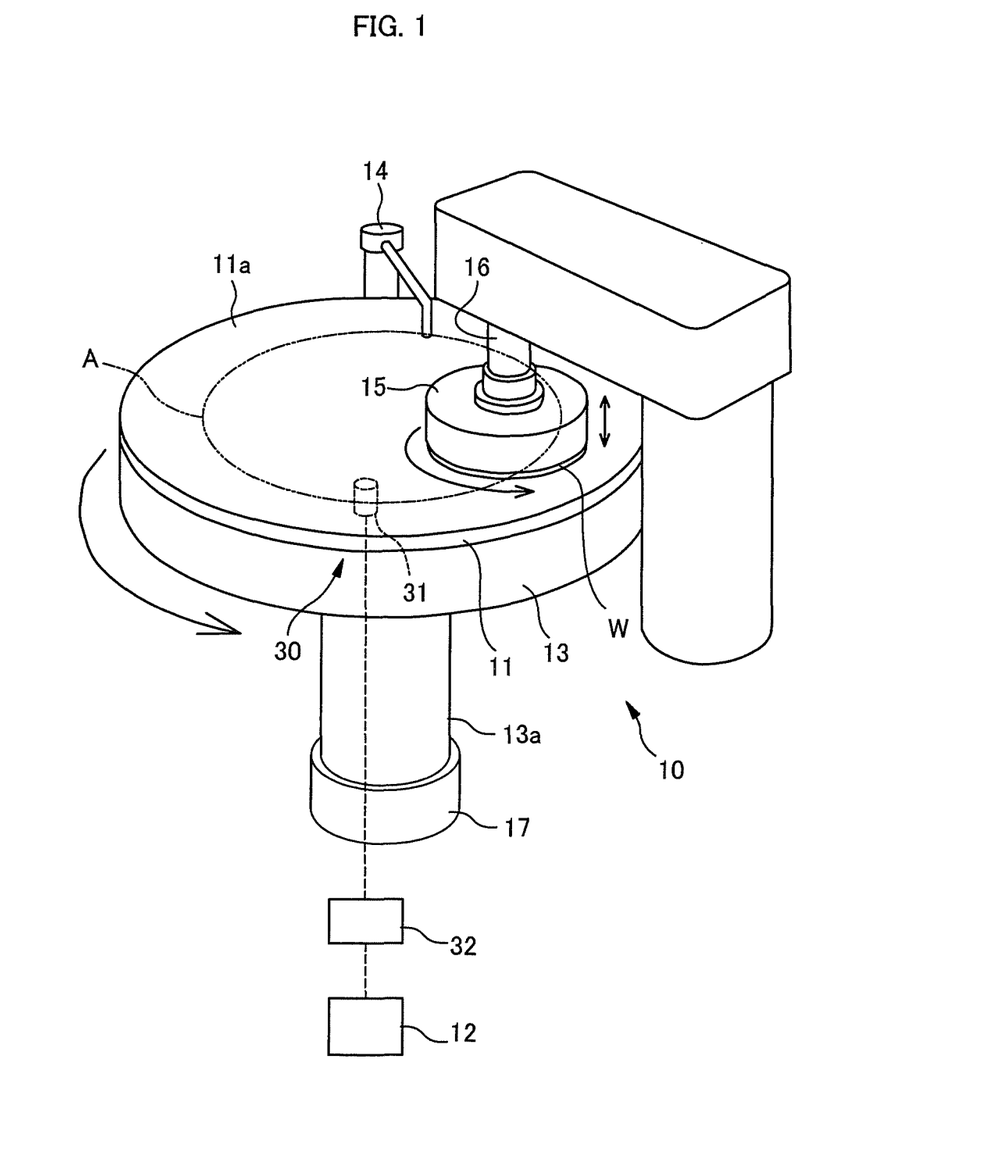
FIG. 1 is a diagram schematically showing the configuration of a substrate polishing apparatus according to one embodiment of the present invention.

FIG. 1 is a diagram showing a polishing apparatus according to one embodiment of the present invention. As shown in FIG. 1, a polishing apparatus 10 includes: a polishing table 13 mounted with a polishing pad 11 having a polishing surface 11*a*; a polishing head 15 used to hold a wafer W, which is an example of substrate, and polish the wafer W while pressing it against the polishing pad 11 on the polishing table 13; a polishing solution supply nozzle 14 for supplying polishing solution (e.g., slurry) onto the polishing pad 11; and a polishing control unit 12 for controlling the polishing of the wafer W.

The polishing table 13 is joined to an underlying table motor 17 through a table shaft 13*a*, and the table motor 17 allows the polishing table 13 to rotate in the direction indicated by the arrow. The polishing pad 11 is attached to the top surface of this polishing table 13, and the top surface of the polishing pad 11 constitutes the polishing surface 11*a* for polishing the wafer W. The polishing head 15 is joined to the bottom end of a polishing head shaft 16. The polishing head 15 is configured to hold the wafer W at the bottom surface by vacuum suction. The polishing head shaft 16 is configured to vertically move through a vertical move mechanism not shown in the drawing.

The wafer W is polished in the following manner. The polishing head 15 and the polishing table 13 are rotated in the respective directions indicated by the arrows, and a polishing solution (slurry) is supplied from the polishing solution supply nozzle 14 onto to the polishing pad 11. In this state, the polishing head 15 presses the wafer W against the polishing surface 11*a* of the polishing pad 11. The surface of the wafer W is polished by mechanical effects of abrasive grain contained in the polishing solution and chemical effects of the polishing solution.

Figure 2:
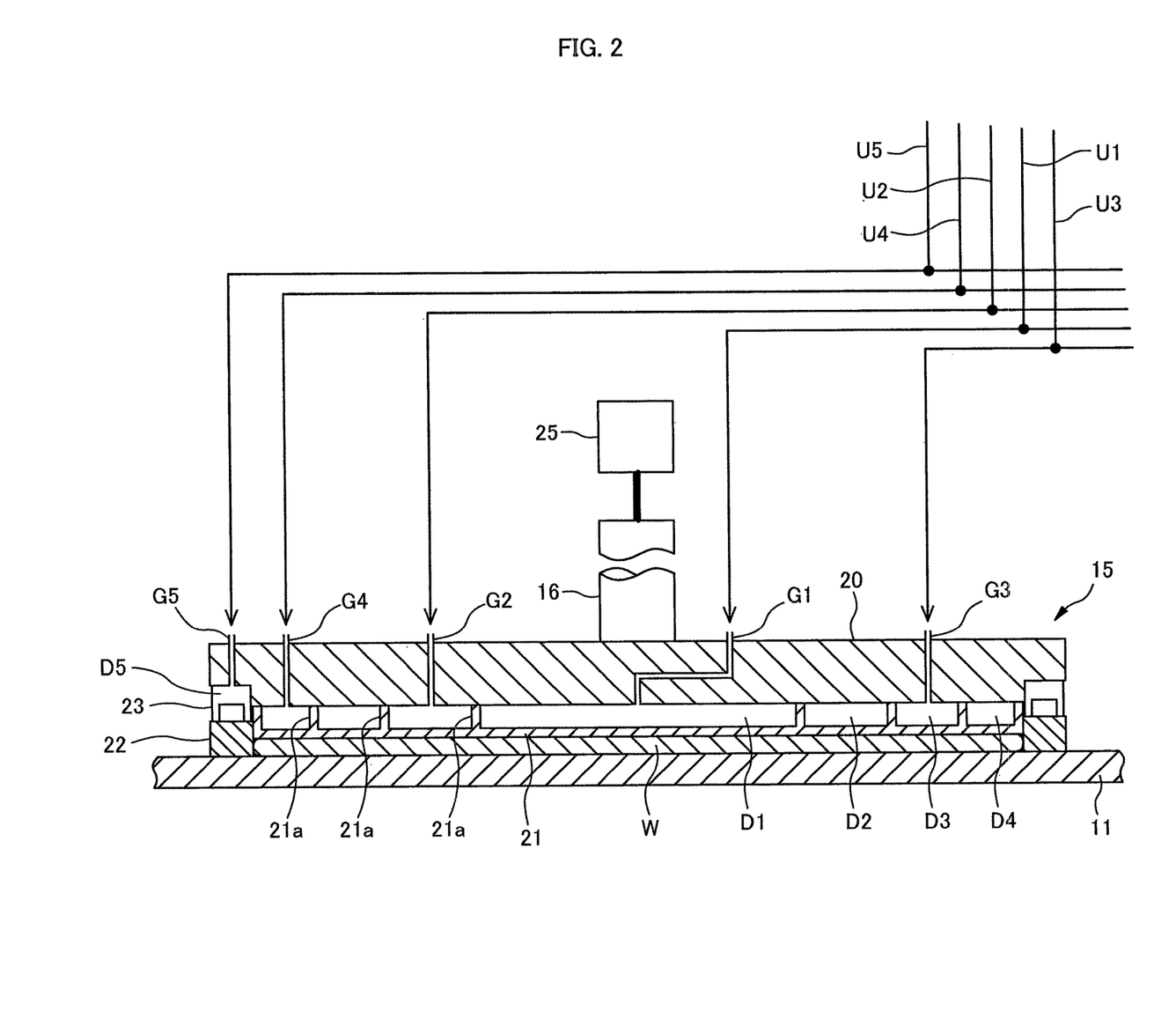
FIG. 2 is a cross-sectional view showing the structure of a polishing head.

FIG. 2 is a cross-sectional view showing the structure of the polishing head 15. The polishing head 15 includes a circular plate-like carrier 20, a circular flexible elastic film 21 that is disposed below the carrier 20 and defines a plurality of pressure chambers (air-bags) D1, D2, D3, and D4, and a retainer ring 22 that is disposed in such a manner that it surrounds the wafer W and presses the polishing pad 11. The pressure chambers D1, D2, D3, and D4 are formed between the elastic film 21 and the bottom surface of the carrier 20.

The elastic film 21 has a plurality of ring-shaped partition walls 21*a*, and the pressure chambers D1, D2, D3, and D4 are separated by these partition walls 21*a*. The pressure chamber D1 disposed in the central portion has a circular shape, and the other pressure chambers D2, D3, and D4 have a ring shape. These pressure chambers D1, D2, D3, and D4 are arranged concentrically.

The pressure chambers D1, D2, D3, and D4 are connected to fluid lines G1, G2, G3, and G4 so that a pressure-adjusted pressurized fluid (e.g., pressurized air or other pressurized gases) can be supplied into the pressure chambers D1, D2, D3, and D4 through the fluid lines G1, G2, G3, and G4. The fluid lines G1, G2, G3, and G4 are connected to vacuum lines U1, U2, U3, and U4 so that negative pressure can be formed in the pressure chambers D1, D2, D3, and D4 through the vacuum lines U1, U2, U3, and U4.

The internal pressures on the pressure chambers D1, D2, D3, and D4 can be changed independently of each other through a processing unit 32, which will be described later, and the polishing control unit 12; thus, the polishing pressures on the respective four regions of the wafer W, i.e., the central portion, inner intermediate portion, outer intermediate portion, and edge portion can be independently adjusted.

The ring-shaped elastic film 21 is disposed between the retainer ring 22 and the carrier 20. The ring-shaped pressure chamber D5 is formed in the elastic film 21. The pressure chamber D5 is connected to the fluid line G5 so that a pressure-adjusted pressurized fluid (e.g., pressurized air) can be supplied into the pressure chamber D5 through the fluid line G5. In addition, the fluid line G5 is connected to the vacuum line U5 so that negative pressure can be formed in the pressure chamber D5 through the vacuum line U5.

With changes in the pressure in the pressure chamber D5, the elastic film 21 and the entire retainer ring 22 vertically move, so that the pressure in the pressure chamber D5 is applied to the retainer ring 22 and the retainer ring 22 can directly press the polishing pad 11 independently of the elastic film 21. During polishing of the wafer W, the retainer ring 22 presses the polishing pad 11 around the wafer W while the elastic film 21 presses the wafer W against the polishing pad 11.

The carrier 20 is fixed to the bottom end of a head shaft 16. The head shaft 16 is joined to the vertical move mechanism 25. This vertical move mechanism 25 is configured to move up and down the head shaft 16 and the polishing head 15, and locate the polishing head 15 at a predetermined height. A combination of a servo motor and a ball screw mechanism is used as this vertical move mechanism 25 functioning as the polishing head positioning mechanism.

The vertical move mechanism 25 locates the polishing head 15 at a predetermined height. In this state, a pressurized fluid is supplied to the pressure chambers D1 to D5. Receiving the pressure in the pressure chambers D1 to D4, the elastic film 21 presses the wafer W against the polishing pad 11 and, receiving the pressure in the pressure chamber D5, the retainer ring 22 presses the polishing pad 11. In this state, the wafer W is polished.

The polishing apparatus 10 includes an optical measuring device 30 that acquires the thickness of the wafer W. This optical measuring device 30 includes an optical sensor 31 that acquires an optical signal varying according to the thickness of the wafer W, and a processing unit 32 that calculates the spectrum of reflected light from the wafer W on the basis of the optical signal.

The optical sensor 31 is disposed in the polishing table 13, and the processing unit 32 is connected to the polishing control unit 12. As indicated by the sign A in FIG. 1, the optical sensor 31 rotates integrally with the polishing table 13 and acquires an optical signal related to the wafer W held by the polishing head 15. The optical sensor 31 is connected to the processing unit 32, and the optical signal acquired through the optical sensor 31 is transmitted to the processing unit 32.

Figure 3:
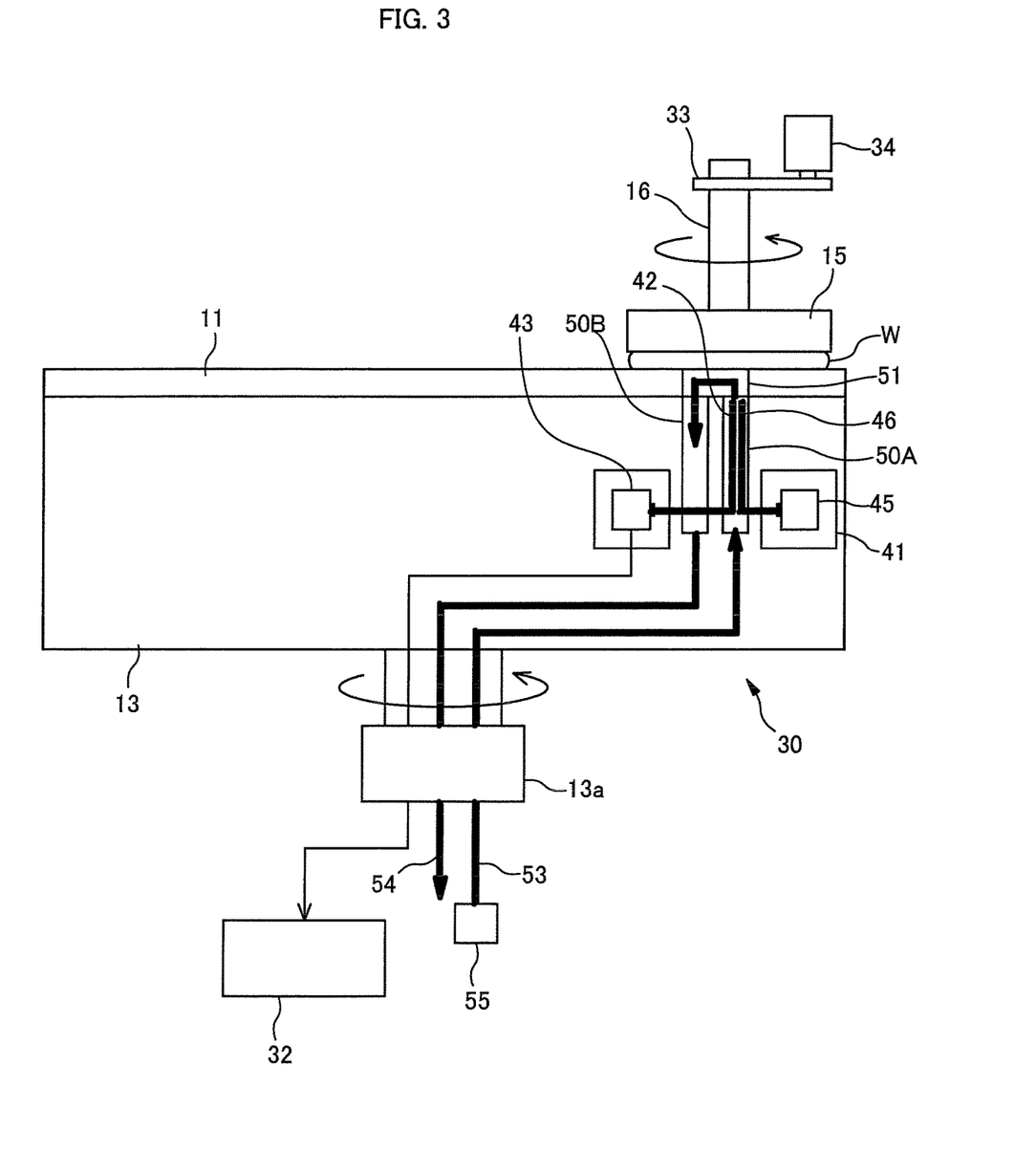
FIG. 3 is a cross-sectional view showing the configuration of an optical measuring device included in the substrate polishing apparatus.

FIG. 3 is a schematic cross-sectional view of a polishing apparatus including the optical measuring device 30. The polishing head shaft 16 is coupled to the polishing head motor 34 through a coupler 33, such as a belt, and is made rotatable. Rotation of this polishing head shaft 16 causes the polishing head 15 to rotate in the direction indicated by the arrow.

The optical measuring device 30 includes the optical sensor 31 and the processing unit 32. The optical sensor 31 is configured to direct light onto the surface of the wafer W, receive reflected light from the wafer W, and disperse the reflected light according to the wavelength. The optical sensor 31 includes a phototransmitter 41 that directs light onto a surface of the wafer W of interest for polishing, an optical fiber 42 that serves as a photoreceptor receiving reflected light returning from the wafer W, and a spectroscope 43 that disperses reflected light from the wafer W according to the wavelength and measures the intensity of the reflected light over a predetermined range of wavelength.

The polishing table 13 has a first hole 50A and a second hole 50B opened on the top surface. In addition, the polishing pad 11 has a through-hole 51 in a position corresponding to the holes 50A and 50B. The holes 50A and 50B are communicated with the through-hole 51. The through-hole 51 is opened on the polishing surface 11a. The first hole 50A is coupled to a liquid supply source 55 through a liquid supply path 53 and a rotary joint (not shown in the drawing), and the second hole 50B is coupled to a liquid exhaust path 54.

The phototransmitter 41 includes a light source 45 emitting multiple-wavelength light, and an optical fiber 46 connected to the light source 45. The optical fiber 46 is an optical transmission line that guides light emitted by the light source 45, to the surface of the wafer W. The front ends of the optical fibers 46 and 42 are located in the first hole 50A and in the vicinity of the polished surface of the wafer W. The front ends of the optical fibers 46 and 42 are disposed so as to face the wafer W held by the polishing head 15. Each time the polishing table 13 rotates, the plurality of regions of the wafer W is irradiated with light. Preferably, the front ends of the optical fibers 46 and 42 are disposed so as to pass through the center of the wafer W held by the polishing head 15.

During polishing of the wafer W, water (preferably pure water) is supplied from the liquid supply source 55 to the first hole 50A through the liquid supply path 53 as a transparent liquid, and fills the space between the bottom surface of the wafer W and the front ends of the optical fibers 46 and 42. Water further flows into the second hole 50B and is exhausted through the liquid exhaust path 54. The polishing solution is exhausted together with water, thereby ensuring an optical path. The liquid supply path 53 is provided with a valve (not shown in the drawing) in synchronization with the rotation of the polishing table 13. This valve operates in such a manner that it stops the water flow or reduces the flow rate of water when the wafer W is not located over the through-hole 51.

Two optical fibers 46 and 42 are disposed in parallel with each other, and their front ends are disposed perpendicularly to the surface of the wafer W. The optical fiber 46 is configured to direct light perpendicularly to the surface of the wafer W.

During polishing of the wafer W, light from the phototransmitter 41 is directed onto the wafer W, and the optical fiber (photoreceptor unit) 42 receives reflected light from the wafer W. The spectroscope 43 measures the intensity of reflected light at each wavelength within a predetermined range of wavelength, and transmits the acquired light intensity data to the processing unit 32. This light intensity data is an optical signal that reflects the thickness of the wafer W and is composed of the intensity of the reflected light and the corresponding wavelength.

Figure 4:
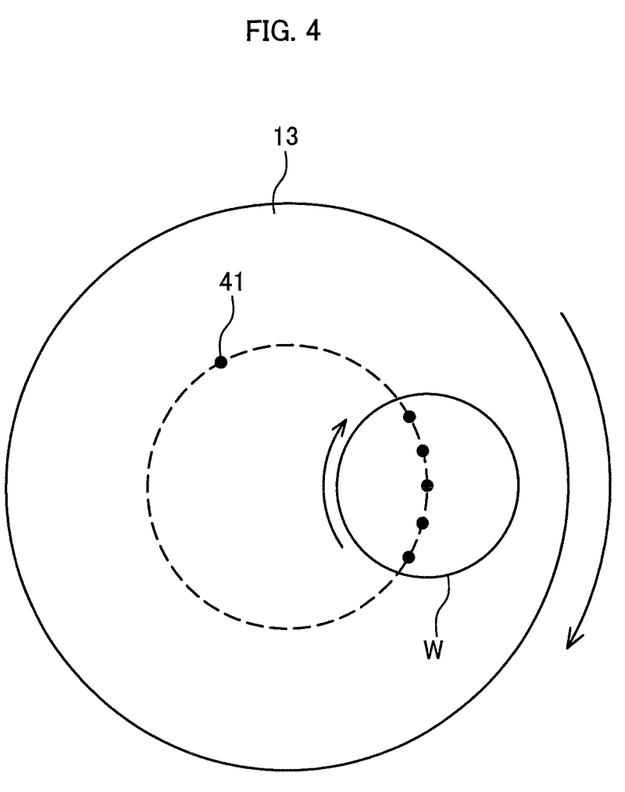
FIG. 4 is a plan view showing a positional relationship between a wafer and a polishing table.

FIG. 4 is a plan view showing a positional relationship between the wafer W and the polishing table 13. The phototransmitter 41 and the photoreceptor unit 42 face the surface of the wafer W. Each time the polishing table 13 rotates, the phototransmitter 41 directs light onto a plurality of regions (a plurality of black dots in FIG. 4) including the center of the wafer W.

The wafer W has a bottom-layer film and a top-layer film (e.g., a silicon layer or insulating film) formed on the bottom-layer film. Light incident on the wafer W reflects off an interface between a medium (e.g., water) and the top-layer film and an interface between the top-layer film and the bottom-layer film, and interference of lightwaves reflected off these interfaces occurs. The way of interference of lightwaves changes depending on the thickness of the top-layer film (i.e., optical length). Accordingly, the spectrum generated from the reflected light from the wafer W changes depending on the thickness of the top-layer film.

The spectroscope 43 disperses reflected light according to the wavelength, and measures the intensity of the reflected light for each wavelength. Further, the processing unit 32 generates a spectrum from reflected light intensity data (an optical signal) obtained through the spectroscope 43. Hereinafter, a spectrum generated from reflected light from the polished wafer W is referred to as a measuring spectrum (reflectivity spectrum). This measuring spectrum is represented by a line graph (i.e., spectral waveform) showing a relationship between the wavelength and intensity of light. Light intensity can be represented by a reflectivity or relative value, such as a relative reflectivity.

Figure 6:
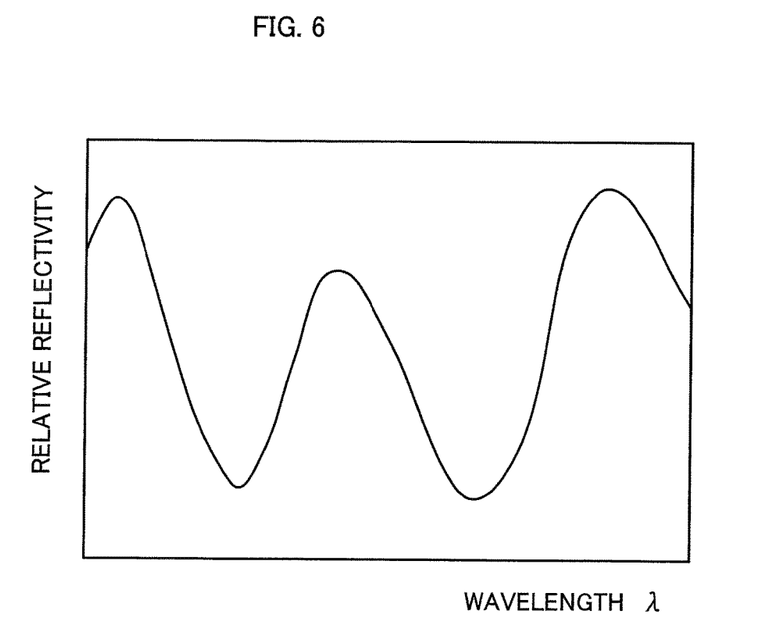
FIG. 6 is an explanatory diagram showing the spectrum of reflected light from the wafer.

FIG. 6 is a diagram showing a measuring spectrum generated by the processing unit 32. The horizontal axis represents the light wavelength, and the vertical axis represents the relative reflectivity calculated based on the intensity of light reflected off the wafer W. Here, a relative reflectivity is an index representing the reflection intensity of light, specifically, a ratio between light intensity and a predetermined reference intensity. At each wavelength, dividing the light intensity (measured intensity) by a reference intensity removes unneeded noise, such as intensity variations unique to each optical system or light source of the apparatus, from the measured intensity, thereby yielding a measuring spectrum that reflects information of a thickness only.

A reference intensity can be defined as, for example, a light intensity obtained when a silicon wafer with no film formed thereon (a bare wafer) is water-polished in the presence of water. In actual polishing, a corrected measured intensity is determined by subtracting a dark level (background intensity obtained under the condition where light is shut out) from a measured intensity; a corrected reference intensity is determined by subtracting the dark level from a reference intensity; and a relative reflectivity is determined by dividing the corrected measured intensity by the corrected reference intensity. To be specific, the relative reflectivity $R(\lambda)$ can be determined using the equation below.

$$R(\lambda)=(E(\lambda)-D(\lambda))/(B(\lambda)-D(\lambda))$$

Here, λ represents a wavelength, E(λ) represents the intensity of light at the wavelength λ reflected off the wafer, B(λ) represents a reference intensity at the wavelength λ, and D(λ) is a background intensity (dark level) at the wavelength λ obtained in the state where light is shut out.

Figure 5:
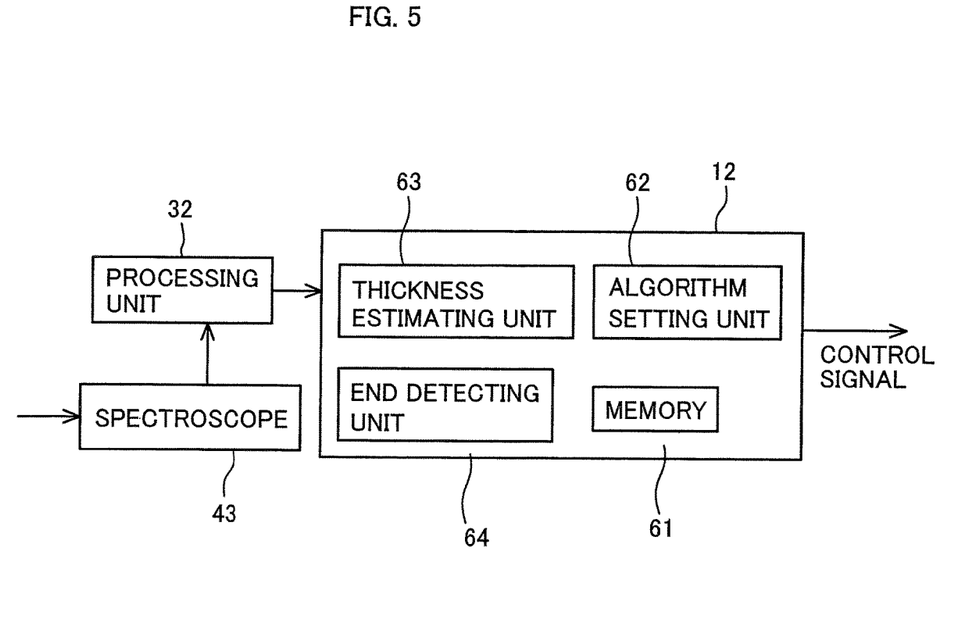
FIG. 5 is a block diagram showing the configuration of a control unit.

FIG. 5 is a block diagram showing the configuration of the polishing control unit 12. The polishing control unit 12 includes a memory 61, an algorithm setting unit 62, a thickness estimating unit 63, and an end detecting unit 64. Although the processing unit 32 and the polishing control unit 12 are separated in this embodiment, the processing unit 32 may be contained in the polishing control unit 12.

The memory 61 stores a program for driving the processing unit 32 and the polishing control unit 12 and various data, such as a processing program for executing a thickness estimating algorithm, which will be described below, and switching conditions in which the thickness estimating algorithm is switched.

The algorithm setting unit 62 selects, as a setting, a plurality of thickness estimating algorithms to be used for polishing the wafer W and the related application conditions, among a plurality of thickness estimating algorithms stored in the memory 61. This setting can be manually input by an operator through an operation input unit, which is not shown in the drawing. Alternatively, the setting can be automatically made according to a material for the polished layer or its base layer, a target thickness obtained upon termination of the polishing, and the like.

The thickness estimating unit 63 applies the thickness estimating algorithm set through the algorithm setting unit 62 to the spectrum of reflected light generated in the processing unit 32, thereby estimating the thickness of the wafer W being polished. In addition, when the thickness of the wafer W being polished has reached a predetermined value or satisfies a predetermined switching condition, the thickness estimating unit 63 switches the thickness algorithm to be applied. The end detecting unit 64 determines whether the estimated thickness has reached a predetermined target value, and if the estimated thickness has reached the predetermined target value, generates a control signal for commanding the termination of the polishing.

Here, the algorithm for estimating the thickness of the wafer W may be, for example, a reference spectrum (Fitting Error) algorithm, a Fast Fourier Transform (FFT) algorithm, a Peak Valley algorithm, or a Polishing Index algorithm.

In the case of the reference spectrum algorithm, a plurality of spectrum groups including a plurality of reference spectra corresponding to different thicknesses is prepared. A spectrum group including a reference spectrum having a form closest to a spectrum signal (reflectivity spectrum) from the processing unit 32 is selected. Further, during the polishing of the wafer, a measuring spectrum for measuring the thickness is generated, a reference spectrum having the closest form is selected from the selected spectrum group, and a thickness corresponding to the reference spectrum is estimated to be the thickness of the wafer being polished.

In the case of the FFT algorithm, a spectrum signal (reflectivity spectrum) from the processing unit 32 is subjected to Fast Fourier Transform (FFT) to extract a frequency component and the related intensity, and the obtained frequency component is converted into the thickness of a polished layer, by using a predetermined relational expression (a function that represents the thickness of the polished layer and can be determined from a measured value and the like). Accordingly, a frequency spectrum indicating a relationship between the thickness of the polished layer and the intensity of the frequency component is generated. If the peak intensity of the spectrum corresponding to the thickness of the polished layer obtained by conversion from the frequency component exceeds a threshold, the frequency component (the thickness of the polished layer) corresponding to that peak intensity is estimated to be the thickness of the wafer being polished.

In the case of the Peak Valley algorithm, for a spectrum signal (reflectivity spectrum) from the processing unit 32, a wavelength which is an extreme point indicating the extreme value (maximum value or minimum value) is extracted. As the thickness of a polished layer decreases, the wavelength which is the extreme point shifts toward the short wavelength side; therefore, monitoring the extreme point with the polishing of the wafer, the thickness of the polished layer can be estimated. Further, at a plurality of points arranged in the radial direction of the wafer, monitoring the wavelength which is the extreme point allows the profile to be obtained.

In the case of the Polishing Index algorithm, in response to a spectrum signal (reflectivity spectrum) from the processing unit 32, the amount of change in the spectrum per predetermined time is calculated, and the amount of change in the spectrum is summed with polishing time, thereby determining a cumulative amount of change in spectrum. The cumulative amount of change in spectrum monotonously increases with the polishing of the wafer, while the thickness monotonously decreases; therefore, a time point at which the cumulative amount of change in spectrum reaches a predetermined target value can be determined to be the termination of the polishing.

Figure 7:
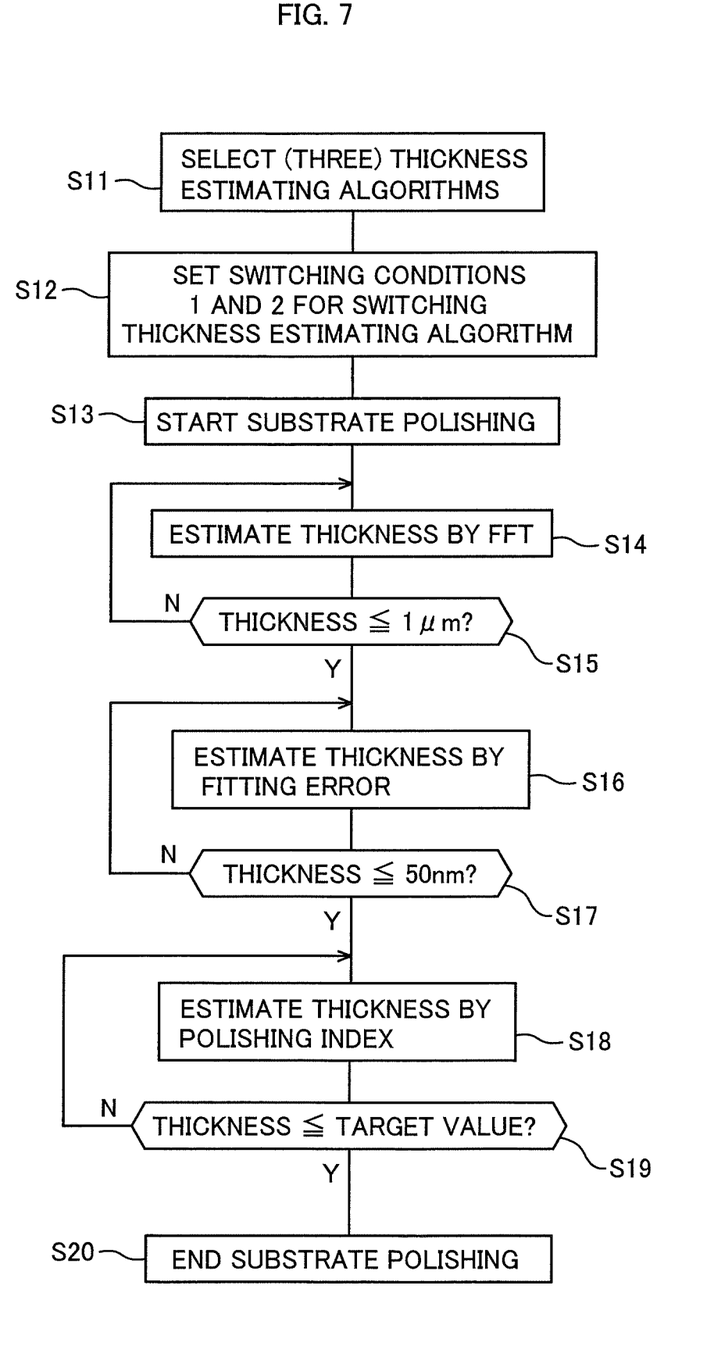
FIG. 7 is a flow chart showing an example process of substrate polishing.

FIG. 7 is a flow chart showing an example in which thickness estimation is performed with switching of the thickness estimating algorithm applied to the wafer W being polished. Information, such as a target value of polishing of the wafer W (the final thickness), a polished layer, and a material for the base layer is input, and a plurality of (three in the example shown in FIG. 7) algorithms used for the estimation of the thickness of the wafer W is selected (Step S11).

In the example shown in FIG. 7, three algorithms: FFT, Fitting Error, and Polishing Index are selected as thickness estimating algorithms. If the wafer W has a large thickness, there is a large number of peaks (peaks and troughs) in the interference waveform of measurement light; therefore, thickness estimation using FFT is preferred. As the thickness decreases, the number of peaks decreases; therefore, for example, if the thickness is less than or equal to 1 μm, thickness estimation is preferably performed using another algorithm (Fitting Error). If the thickness further decreases, for example, to less than or equal to 50 nm, it is difficult to find an interference pattern; therefore, it is preferable to estimate a thickness based on the amount of change in interference waveform using the Polishing Index algorithm.

Accordingly, in the example shown in FIG. 7, in the algorithm setting unit 62, processing programs for the thickness estimating algorithms of FFT, Fitting Error, and Polishing Index are read from the memory 61, and FFT, Fitting Error, and Polishing Index are set in this order (Step S11). In addition, the conditions that the thickness of a layer of interest for polishing in the wafer W is less than or equal to 1 μm (switching condition 1) and less than or equal to 50 nm (switching condition 2) are set as conditions for switching the algorithm (Step S12). Afterwards, substrate polishing is started (Step S13).

Upon initiation of substrate polishing, the thickness estimating unit 63 estimates the thickness of the wafer W being polished, according to the FFT algorithm (Step S14). Subsequently, whether the thickness is less than or equal to 1 μm (whether the switching condition 1 is satisfied) is determined (Step S15). If the condition is not satisfied (the estimated thickness exceeds 1 μm), the process returns to Step S14 and thickness estimation based on the FFT algorithm is repeated while the wafer W is polished.

On the contrary, if the switching condition 1 is satisfied, the thickness estimating unit 63 estimates the thickness of the wafer W being polished, according to the Fitting Error algorithm (Step S16). Subsequently, whether the thickness is less than or equal to 50 nm (whether the switching condition 2 is satisfied) is determined (Step S17). If the condition is not satisfied (the estimated thickness exceeds 50 nm), the process returns to Step S16 and thickness estimation based on the Fitting Error algorithm is repeated while the wafer W is polished.

If the switching condition 2 is satisfied, the thickness estimating unit 63 estimates the thickness of the wafer W being polished, according to the Polishing Index algorithm (Step S18). Subsequently, whether the thickness has reached a target value is determined (Step S19). If the target value has been reached, the end detecting unit 64 outputs a control signal for terminating substrate polishing (Step S20). On the contrary, if the thickness has not reached the target value, the process returns to Step S18 and thickness estimation based on the Polishing Index algorithm is repeated while the wafer W is polished.

Since the thickness estimating algorithm to be used is switched according to the thickness of the substrate in this manner, application of a thickness estimating algorithm according to the progress of substrate polishing allows for more accurate estimation of thickness and proper detection of the end of substrate polishing.

Figure 8:
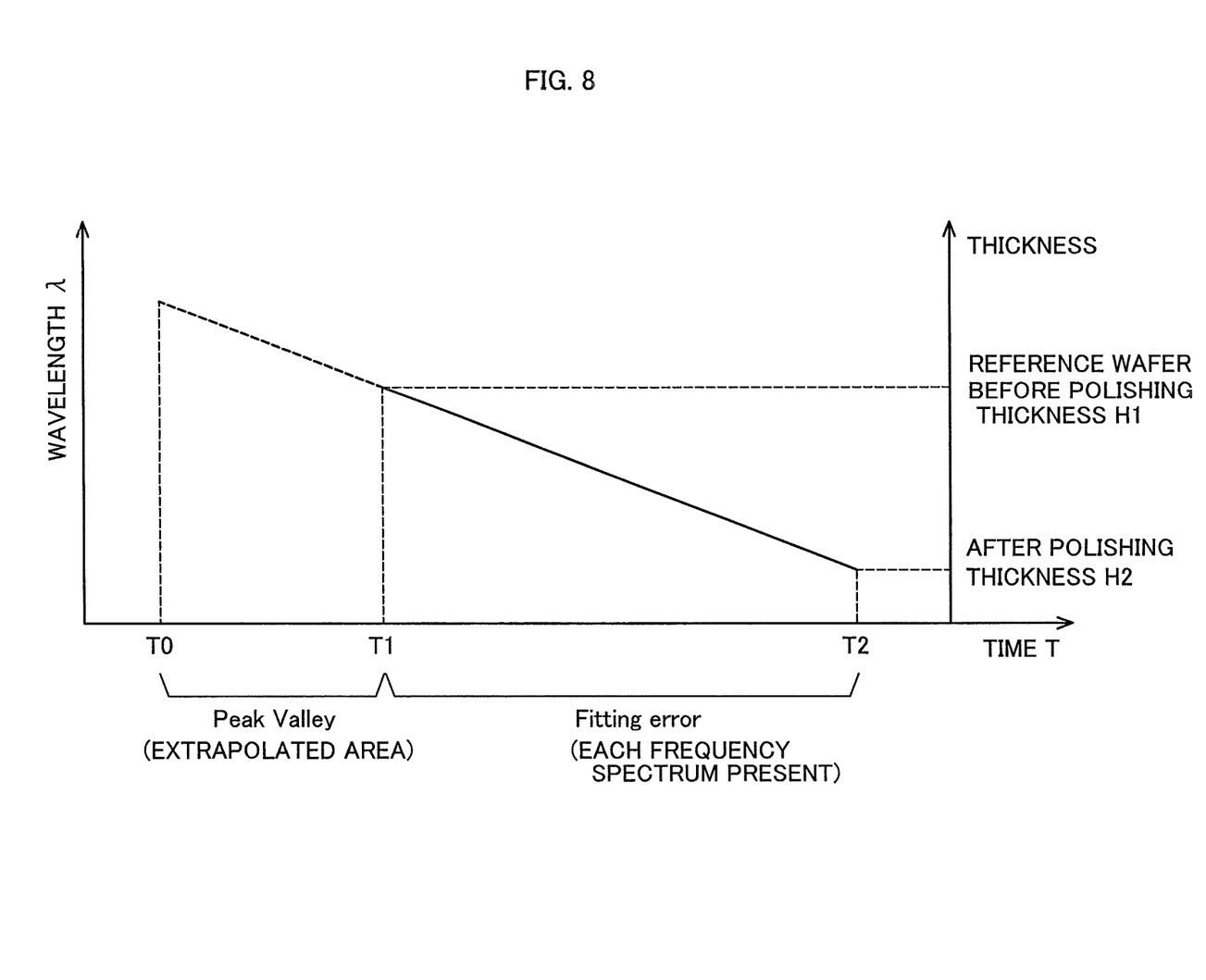
FIG. 8 is a graph showing another example of substrate polishing.

The method of switching the thickness estimating algorithm according to the present invention is not limited to the above-described example, and appropriate methods can be used in combination. FIG. 8 shows an example in which the Peak Valley algorithm and the Fitting Error algorithm are combined. The Fitting Error algorithm is based on the premise that only the reference spectra corresponding to the range H1-H2 of thickness (only data of a thickness and reference spectrum measured with a reference wafer having a thickness in the range H1-H2) is stored in the memory 61. In other words, the range of thickness that can be estimated by the Fitting Error algorithm is supposed to be H1-H2.

In this case, if the wafer W to be polished has a thickness exceeding H2, it is difficult to estimate the thickness of the substrate by the Fitting Error algorithm. For this reason, as shown in FIG. 8, the polishing rate is estimated to be constant in the period in which the Fitting Error is applicable (the thickness H1-H2), and the period in which the thickness exceeds H1 is extrapolated. In the extrapolated area (extrapolated area), thickness estimation is performed based on the Peak Valley algorithm.

In the example shown in FIG. 8, upon start of the polishing of a substrate, which has a thickness exceeding H2, at the time T0, the thickness estimating unit 63 estimates the thickness using the Peak Valley algorithm. Subsequently, at the time T1 when the thickness of the wafer W becomes H1, the thickness estimating unit 63 switches the estimating algorithm to the Fitting Error algorithm and performs the estimation of the thickness of the wafer W. A thickness that cannot be treated by one thickness estimating algorithm is subjected to thickness estimation using another algorithm; thus, a wider range of thickness can be treated.

In the above-described embodiment, a single thickness estimating algorithm is applied to each thickness estimation, which may make the estimated thickness discontinuous upon switching between a plurality of algorithms. For this reason, it is preferable to apply a plurality of algorithms concurrently during a certain period before switching.

Figure 9:
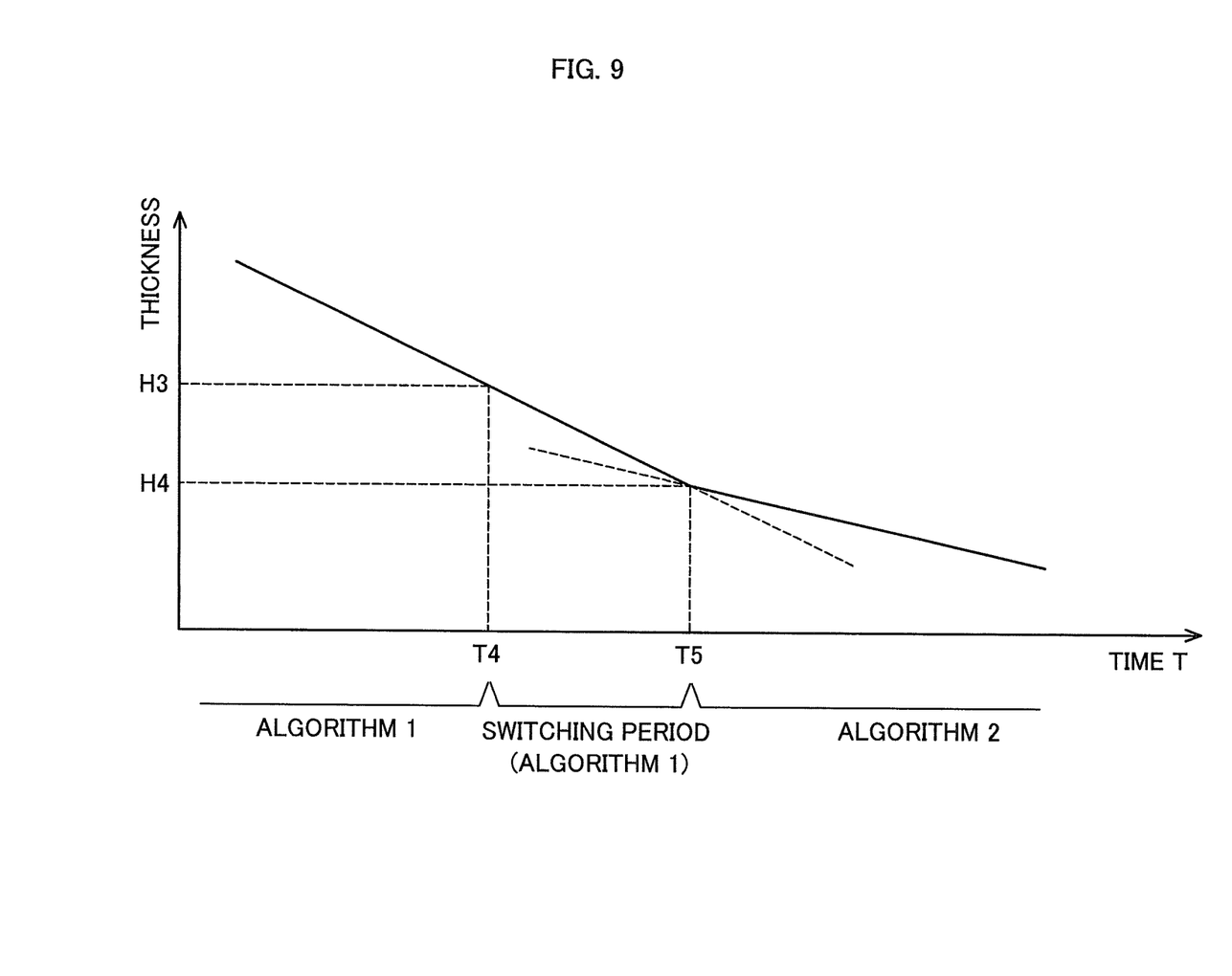
FIG. 9 is a graph showing an example process for switching the thickness estimating algorithm.

FIG. 9 shows an example in which the algorithm to be applied is switched when a thickness estimated by two algorithms is a minimum value (or at or below a predetermined value). In the case where thickness estimation is performed using the algorithm 1 while substrate polishing is performed and the estimated thickness becomes H3 at the time T4, the thickness estimating unit 63 continues thickness estimation using the algorithm 1 while performing thickness estimation using another algorithm 2.

Subsequently, if the thicknesses estimated using these two algorithms 1 and 2 match at the H4 (or become at or below a predetermined value) at the time T5, the thickness estimating unit 63 switches the algorithm applied to the algorithm 2. This prevents the estimated thickness from being discontinuous upon switching of the algorithm.

Figure 10:
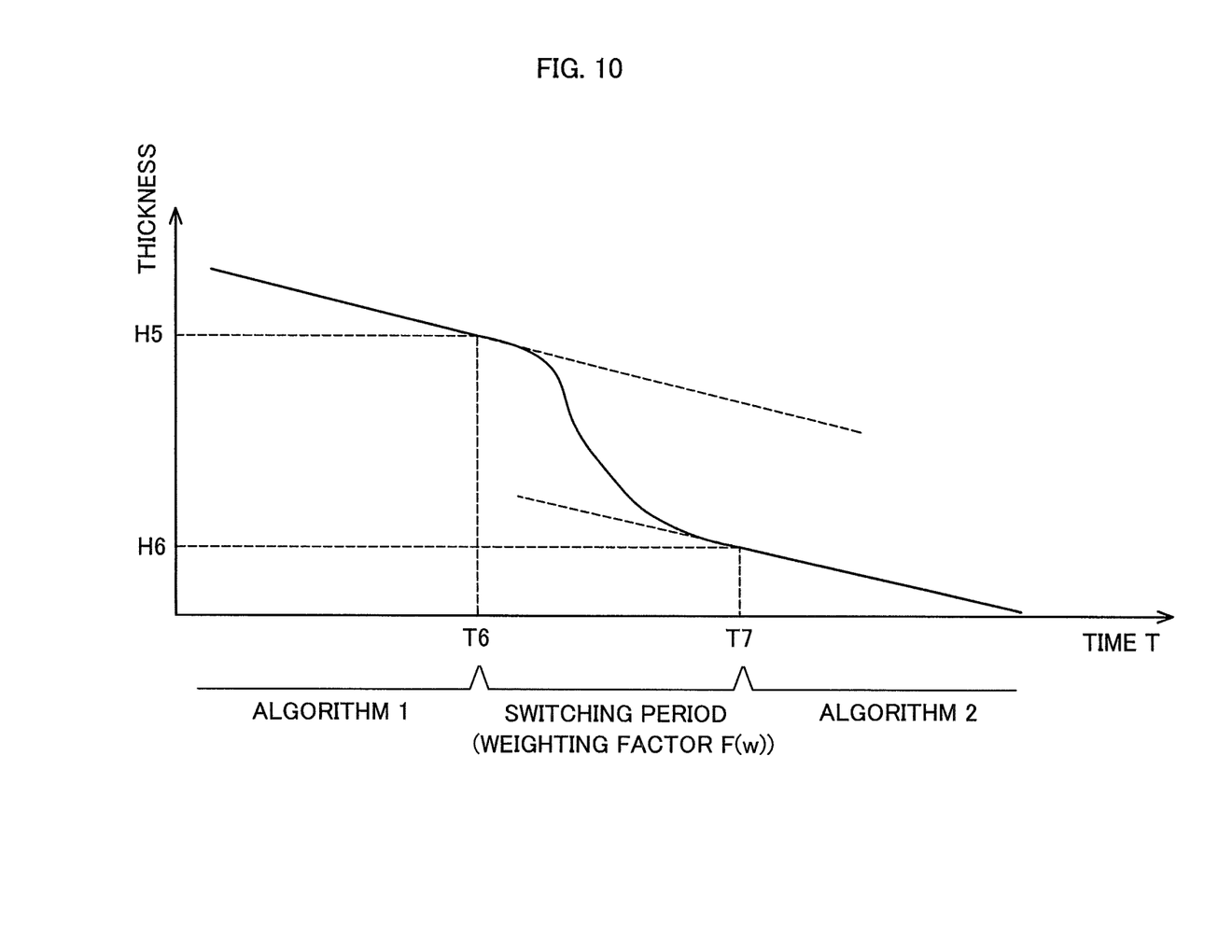
FIG. 10 is a graph showing another example process for switching the thickness estimating algorithm.

FIG. 10 shows another example in which a plurality of algorithms is concurrently applied. In this example, in the case where thickness estimation is performed using the algorithm 1 while substrate polishing is performed and the thickness estimated at the time T6 becomes H5, the thickness estimating unit 63 performs thickness estimation using the algorithms 1 and 2 and estimates a thickness F(w) using the equation below.

$$F(w)=(1-w)\times x1+w\times x2$$

Here, x1 represents a thickness estimated using the algorithm 1, x2 represents a thickness estimated using the algorithm 2, and w represents a weighting factor expressed by the equation below where a time T is an input value.

$$w(T)=(T-T6)/(T7-T6)$$

In this manner, a plurality of algorithms is concurrently used for thickness estimation while a weighting factor w is used, thereby preventing the estimated thickness from being discontinuous upon switching of the algorithm.

The above embodiment has been described so that those possessing general knowledge in the technical field that the present invention belongs to can implement the present invention. Various modifications of the above embodiment can be made by those skilled in the art as a matter of course, and the technological thought of the present invention can be applied to other embodiments. The present invention should not be limited to the above-described embodiment and should be construed in the widest range according to the technological thought defined by the claims.

What is claimed is:
1. A substrate polishing apparatus comprising:
a top ring for pressing a substrate against a polishing pad to perform substrate polishing;
a phototransmitter arranged to direct light onto a surface of the substrate;
a photoreceptor arranged to receive the light reflected from the surface of the substrate, and a processor configured to calculate a reflectivity spectrum corresponding to the wavelength of the reflected light received from a spectroscope in communication with the photoreceptor;
a memory that stores a plurality of thickness estimating algorithms for estimating a thickness of a polished surface in accordance with the reflectivity spectrum;
a controller configured to select a first thickness estimating algorithm and a second thickness estimating algo- rithm among the plurality of thickness estimating algorithms stored in the memory, and set a switching condition; and the controller further configured to estimate the thickness of the polished surface during polishing based on the reflectivity spectrum calculated by the processor by using the first and the second thickness estimating algorithms, and configured to switch the thickness estimating algorithm from the first thickness estimating algorithm to the second thickness estimating algorithm to be used for determining polishing end when the set switching condition is satisfied.

2. The substrate polishing apparatus according to claim 1, wherein the controller is configured to output a control signal indicating an end of the substrate polishing when the estimated thickness of the polished surface reaches a predetermined target value.

3. The substrate polishing apparatus according to claim 1, wherein the switching condition is that the estimated thickness of the polished surface by use of the first thickness estimating algorithm reaches a set value.

4. The substrate polishing apparatus according to claim 1, wherein the switching condition is that a difference between the thicknesses estimated using the first and second thickness estimating algorithms is below a predetermined value.

5. The substrate polishing apparatus according to claim 1, wherein before the thickness estimating algorithm to be used for determining polishing end is switched, the thickness of the polished surface is estimated through a weighting function using the first and second thickness estimating algorithms.

6. The substrate polishing apparatus according to claim 1, wherein the first thickness estimating algorithm is a first algorithm that estimates the thickness of the polished surface by using Fast Fourier Transform (FFT) and the second thickness estimating algorithm is a second algorithm that estimates the thickness of the polished surface by using reference spectrums (Fitting Error).

7. A substrate polishing method for pressing a substrate against a polishing pad to perform substrate polishing, comprising the steps of:

directing light onto a surface of the substrate of interest for polishing, receiving reflected light, and calculating a reflectivity spectrum corresponding to the wavelength of the reflected light;

selecting a first thickness estimating algorithm and a second thickness estimating algorithm by using a storage that stores a plurality of thickness estimating algorithms for estimating a thickness of a polished surface in accordance with the reflectivity spectrum, and setting a switching condition; and estimating the thickness of the polished surface during polishing based on the reflectivity spectrum calculated by a processor by using the first and the second thickness estimating algorithms, and when the switching condition is satisfied, automatically switching the thickness estimating algorithm from the first thickness estimating algorithm to the second thickness estimating algorithm to be used for determining polishing end.

\* \* \* \* \*